US010803798B2

(12) United States Patent
Li

(10) Patent No.: US 10,803,798 B2
(45) Date of Patent: Oct. 13, 2020

(54) AMOLED PANEL AND METHOD FOR REDUCING DISPLAY LUMINANCE UNEVENNESS THEREOF

(71) Applicant: Wuhan China Star Optoelectronics Semiconductor Display Technology Co., Ltd., Wuhan (CN)

(72) Inventor: Shuang Li, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 107 days.

(21) Appl. No.: 16/133,714

(22) Filed: Sep. 18, 2018

(65) Prior Publication Data
US 2019/0266944 A1 Aug. 29, 2019

Related U.S. Application Data

(63) Continuation of application No. PCT/CN2018/079576, filed on Mar. 20, 2018.

(30) Foreign Application Priority Data

Feb. 24, 2018 (CN) .......................... 2018 1 0159372

(51) Int. Cl.
H01L 51/52 (2006.01)
G09G 3/3233 (2016.01)
H01L 27/32 (2006.01)

(52) U.S. Cl.
CPC ....... *G09G 3/3233* (2013.01); *H01L 27/3244* (2013.01); *H01L 27/3265* (2013.01); *H01L 51/5203* (2013.01); *G09G 2320/0233* (2013.01); *H01L 2251/558* (2013.01)

(58) Field of Classification Search
None
See application file for complete search history.

(56) References Cited

U.S. PATENT DOCUMENTS

| 6,738,106 | B1* | 5/2004 | Tanahara | G02F 1/136213 349/38 |
| 8,941,309 | B2* | 1/2015 | Wu | H05B 45/60 315/169.3 |
| 9,142,159 | B2 | 9/2015 | Inoue et al. | |
| 2007/0075939 | A1* | 4/2007 | Cho | G09G 3/3233 345/76 |

(Continued)

FOREIGN PATENT DOCUMENTS

| CN | 1719503 A | 1/2006 |
| CN | 103576358 A | 2/2014 |

(Continued)

*Primary Examiner* — Shaun M Campbell

(57) ABSTRACT

The present disclosure discloses an AMOLED panel and a method for reducing the display luminance unevenness thereof. The panel with different thicknesses, the panel having at least a first region having a first thickness and a second region having a second thickness; a unit pixel driving circuit in the first region and a unit pixel driving circuit in the second region have storage capacitors with different capacitance values such that the panel has a same display luminance in the first region and the second region.

19 Claims, 6 Drawing Sheets

(56) References Cited

U.S. PATENT DOCUMENTS

| | | | |
|---|---|---|---|
| 2010/0103339 A1* | 4/2010 | Shimoshikiryoh | G09G 3/3648 349/39 |
| 2014/0159019 A1* | 6/2014 | Jung | H01L 27/3265 257/40 |
| 2015/0138214 A1 | 5/2015 | Roh et al. | |
| 2016/0327820 A1 | 11/2016 | Wu | |
| 2017/0186832 A1* | 6/2017 | Zhang | H01L 27/1255 |
| 2018/0233081 A1* | 8/2018 | Kishi | G09G 3/3233 |
| 2019/0096326 A1* | 3/2019 | Yuan | G09G 3/3241 |
| 2019/0385518 A1* | 12/2019 | Hwang | H01L 51/5209 |

FOREIGN PATENT DOCUMENTS

| | | |
|---|---|---|
| CN | 103915431 A | 7/2014 |
| CN | 105719613 A | 6/2016 |
| CN | 106504707 A | 3/2017 |
| CN | 106783915 A | 5/2017 |
| CN | 106835028 A | 6/2017 |
| CN | 107123394 A | 9/2017 |
| CN | 107507573 A | 12/2017 |
| CN | 206947383 U | 1/2018 |

\* cited by examiner

AMOLED PANEL AND METHOD FOR REDUCING DISPLAY LUMINANCE UNEVENNESS THEREOF

CROSS-REFERENCE TO RELATED APPLICATIONS

The present application is a continuation-application conversion of International (PCT) Patent Application No. PCT/CN2018/079576 filed on Mar. 20, 2018, which claims foreign priority of Chinese Patent Application No. 201810159372.7 filed on Feb. 24, 2018 in the State Intellectual Property Office of China, the contents of all of which are hereby incorporated by reference.

TECHNICAL FIELD

The present disclosure relates to a technical field of liquid crystal display technology, and particularly to an AMOLED panel and a method for reducing display, luminance unevenness thereof.

BACKGROUND

Organic light emitting diode (OLED) display panel involves many advantages of such as self-luminescence, a low driving voltage, a high luminous efficiency, a quick response, a high definition and image contrast, a viewing angle of nearly 180°, and a wide operating temperature range, and thus are widely used in smart phones, tablets, full-color TVs and so on.

The OLED display panel can be classified into a passive matrix (PM) type and an active matrix (AM) type according to the driving modes, in which the active matrix organic light emitting diode (AMOLED) technology is one of the key developing directions of flexible displaying.

One of the common problems of the AMOLED panel is displaying luminance unevenness, and an uneven film thickness in the OLED vapor disposition process is one of the reasons that lead to the luminance unevenness of the panel.

Therefore, how to improve the display luminance unevenness of the AMOLED panel caused by uneven film thickness of the panel is a problem that urgently needs to be solved.

SUMMARY

A technical problem to be solved by the present disclosure is to provide a method for reducing display luminance unevenness of AMOLED panel and an AMOLED panel, so as to improve the display luminance unevenness of the AMOLED panel caused by the uneven film thickness of the panel, further to improve the AMOLED display quality.

In order to solve the above technical problem, a technical solution adopted by the present disclosure is to provide an AMOLED panel with different thicknesses, the panel having at least a first region having a first thickness and a second region having a second thickness, the panel comprising: a substrate; a first electrode plate located on the substrate and being in the first region; a second electrode plate located on the substrate and juxtaposed with the first electrode plate and being in the second region, wherein the second electrode plate has an area different from that of the first electrode plate; an insulating layer located on the first and second electrode plates in the first and second regions; a first opposite electrode plate above the first electrode plate and located on the insulating layer and being in the first region; a second opposite electrode plate above the second electrode plate and located on the insulating layer and being in the second region; and a unit pixel driving circuit having storage capacitors with different capacitance values such that the panel has a same display luminance in the first region and the second region, the storage capacitors comprising: a first storage capacitor located in the first region and comprising the substrate, the first electrode plate, the first opposite electrode plate and the insulating layer; and a second storage capacitor located in the second region and comprising the substrate, the second electrode plate, the second opposite electrode plate and the insulating layer; wherein when the first thickness is greater than the second thickness, a capacitance value of the first storage capacitor is greater than that of the second storage capacitor.

In order to solve the above technical problems, another technical solution adopted by the present disclosure is to provide an AMOLED panel with different thicknesses, the panel having at least a first region having a first thickness and a second region having a second thickness; wherein a unit pixel driving circuit having storage capacitors with different capacitance values such that the panel has a same display luminance in the first region and the second region.

In order to solve the above technical problems, a further technical solution adopted by the present disclosure is to provide a method for reducing display luminance unevenness of an AMOLED panel, including: obtaining distribution regions of the AMOLED panel with different film thicknesses, the distribution regions including at least a first region having a first thickness and a second region having a second thickness, and forming storage capacitors with different capacitance values in a unit pixel driving circuit of the first region and of the second region, to provide the first region and the second region with a same display luminance.

The effect of the method for reducing the display luminance unevenness of the AMOLED panel and the AMOLED panel according to the present disclosure, by obtaining distribution regions of the AMOLED panel with different film thicknesses; the distribution regions including at least a first region having a first thickness and a second region having a second thickness, storage capacitors with different capacitance values are formed in the unit pixel driving circuits of the first region and of the second region so that the first region and the second region may share the same display luminance. In the present disclosure, by configuring different storage capacitor values in regions with different film thicknesses, the display luminance of the pixel points corresponding to different storage capacitor values are different, so that the display luminance unevenness of the AMOLED panel caused by uneven film thickness can be reduced, thus increasing the AMOLED display quality.

DETAILED DESCRIPTION

In the specification and claims, some terms are used to refer to particular components, and those skilled in the art would understand that the manufacturer may name the same components by different terms. This specification and the claims of the present disclosure may not distinguish the components by the difference in name, but use the difference in the function of the components as a standard for distinguishing. The present disclosure will be described in detail below with reference to the accompanying drawings and embodiments.

Figure 1:
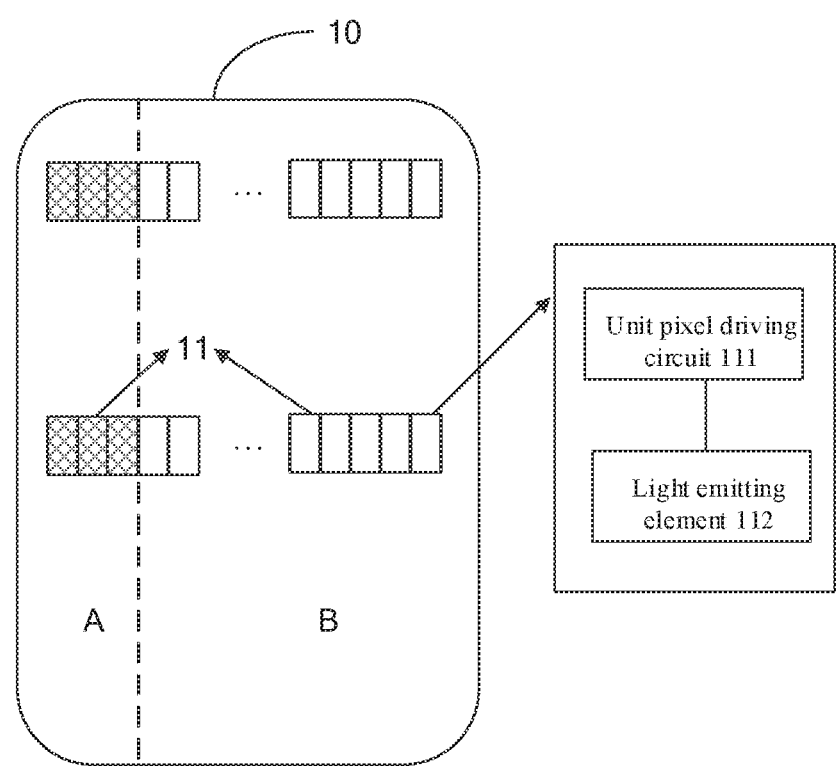
FIG. 1 is a schematic plan view of an AMOLED panel according to a first embodiment of the present disclosure.

FIG. 1 is a schematic plan view of an AMOLED panel according to a first embodiment of the present disclosure. As shown in FIG. 1, the AMOLED panel 10 with different thicknesses may include a first region A having a first thickness and a second region B having a second thickness, and may include a plurality of pixel points 11 disposed in a matrix distribution on the AMOLED panel 10. Each pixel point 11 may include a unit pixel driving circuit 111 and a light emitting element 112, and the unit pixel driving circuit 111 may be configured to drive the light emitting element 112 to emit light to display the corresponding pixel point 11.

Figure 2:
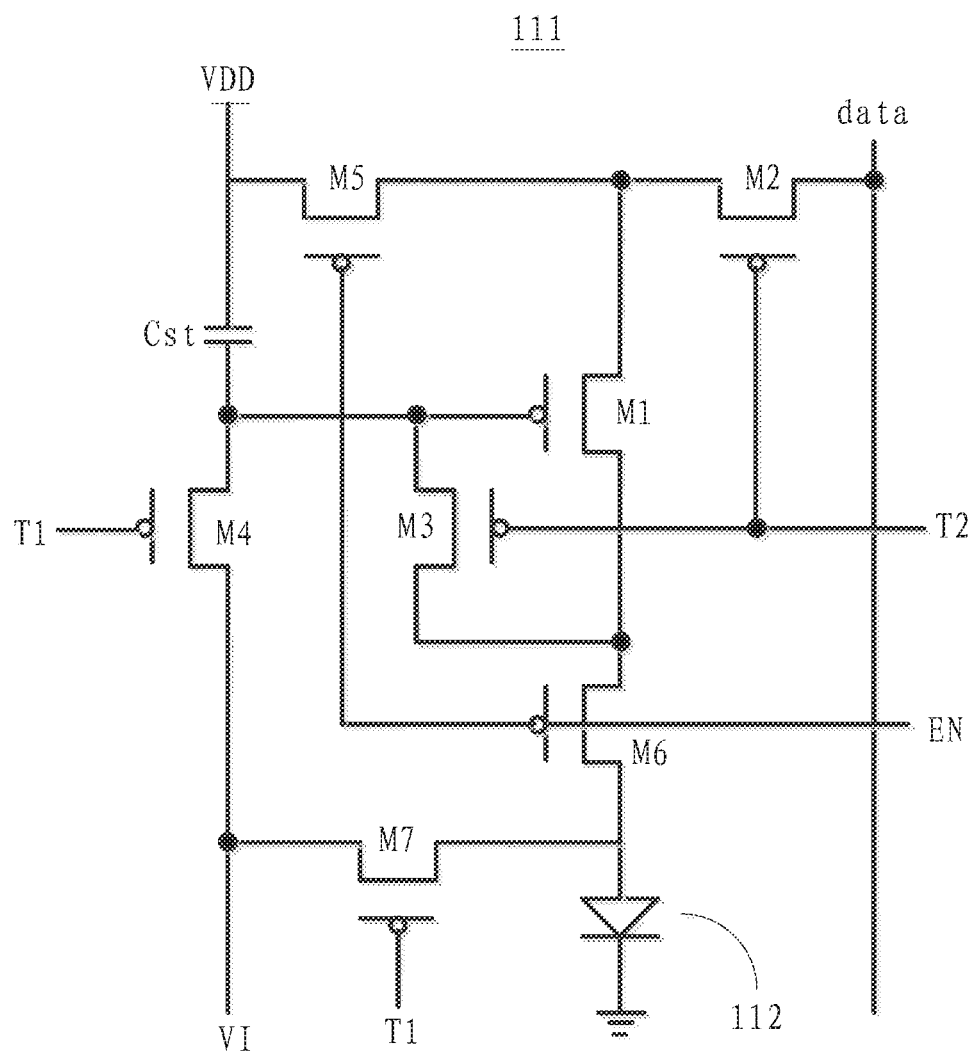
FIG. 2 is a circuit schematic diagram of a unit pixel driving circuit in the AMOLED panel shown in FIG. 1.

Also referring to FIG. 2, FIG. 2 is a circuit schematic diagram of a unit pixel driving circuit in the AMOLED panel shown in FIG. 1. As shown in FIG. 2, the unit pixel driving circuit 111 may include a first thin film transistor M1, a second thin film transistor M2, a third thin film transistor M3, a fourth thin film transistor M4, a fifth thin film transistor M5, a sixth thin film transistor M6, and a seventh thin film transistor M7 and a storage capacitor Cst.

The second thin film transistor M2 may include a first end configured to receive a data signal Data, a gate electrode configured to receive a second control signal T2, and a second end connected to a first end of the fifth thin film transistor M5 and a second end of the first thin film transistor M1.

The fifth thin film transistor M5 may include a gate electrode connected to a gate electrode of the sixth thin film transistor M6 to receive an enable signal EN, and a second end connected to one end of the storage capacitor Cst to receive a power signal VDD.

The third thin film transistor M3 may include a first end connected to a gate electrode of the first thin film transistor M1, another end of the storage capacitor Cst, and a second end of the fourth thin film transistor M4, a gate electrode connected to the gate electrode of the second thin film transistor M2 to receive the second control signal T2, and a second end connected to a first end of the first thin film transistor M1 and a second end of the sixth thin film transistor M6.

The sixth thin film transistor M6 may include a first end connected to a first end of the seventh thin film transistor M7 and an anode of the light emitting element 112. The seventh thin film transistor M7 may include a gate electrode configured to receive a first control signal T1, and a second end connected to a first end of the fourth thin film transistor M4 to receive the reset voltage V1. The fourth thin film transistor M4 may include a gate electrode configured to receive the first control signal T1. The light emitting element 112 may include a cathode which may be grounded.

In this embodiment, the first end may refer to the source electrode of the thin film transistor and the second end may refer to the drain electrode of the thin film transistor, in other embodiments, the first end may also be the drain electrode and the second end may be the source electrode of the thin film transistor.

In this embodiment, the first thin film transistor M1 to the seventh thin film transistor M7 may be the P-type thin film transistors. In other embodiments, the first thin film transistor M1 to the seventh thin film transistor M7 may also be the N-type thin film transistors.

In this embodiment, the first thin film transistor M1 may be a driving transistor, and the light emitting element 112 may be an organic light emitting diode.

In this embodiment, the first control signal T1 may be an (N-1)th stage scanning signal SCAN[n-1], the second control signal T2 may be a Nth stage scanning signal SCAN[n], and the enable signal EN may be a Nth stage control signal OM[n].

Figure 3:
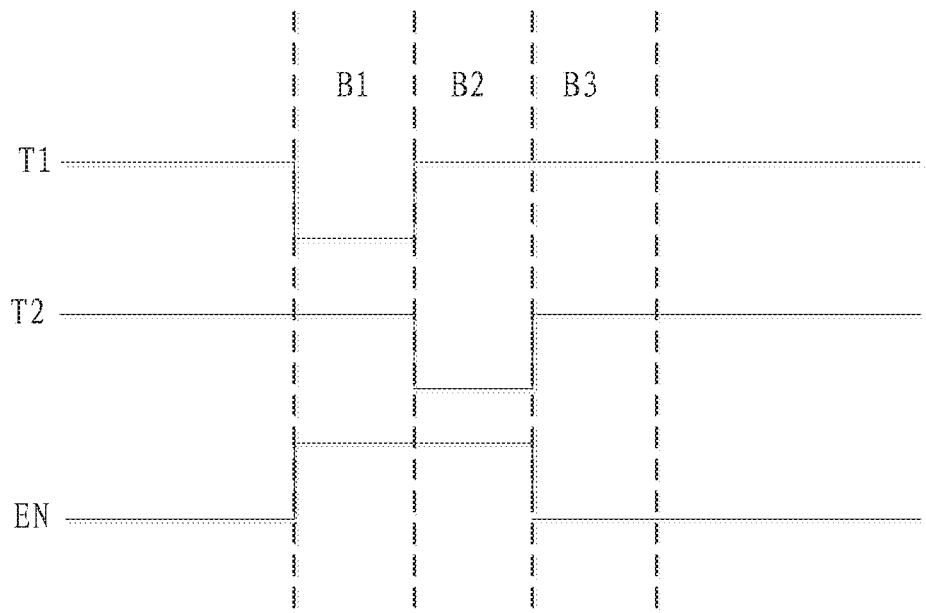
FIG. 3 is a sequence diagram of the control signals of the unit pixel driving circuit shown in FIG. 2.

Referring to FIG. 3, FIG. 3 is a sequence diagram of the control signals of the unit pixel driving circuit shown in FIG. 2. As shown in FIG. 3, an operation process of the unit pixel driving circuit 111 may be divided into an initialization phase B1, a data writing phase 132, and a light emitting phase 133.

In the initialization phase B1, the first control signal T1 is a low voltage level signal, the second control signal T2 is a high voltage level signal, and the enable signal EN is a high voltage level signal, the fourth thin film transistor M4 and the seventh thin film transistor M7 are turned on. In this case, the gate electrode of the first thin film transistor M1 and the anode of the light emitting element D1 are reset to the reset voltage V1.

Figure 4:
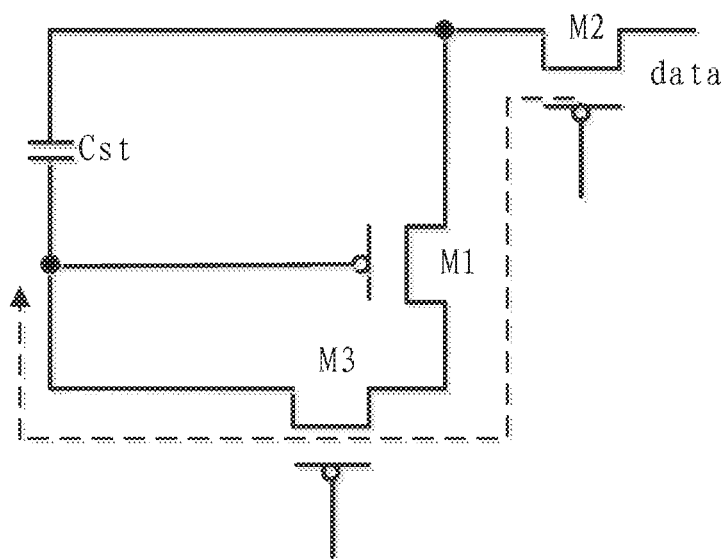
FIG. 4 is a schematic diagram of a charging path of a storage capacitor in the unit pixel driving circuit shown in FIG. 2.

In the data writing stage B2, the first control signal T1 is a high voltage level signal, the second control signal T2 is a low voltage level signal, and the enable signal EN is a high voltage level signal, the second thin film transistor M2 and the third thin film transistor M3 are turned on. In this case, as the third thin film transistor M3 is turned on, the gate electrode and the second end of the first thin film transistor M1 are shorted connected to form a diode connection structure. As shown in FIG. 4, as the second thin film transistor M2 is turned on, the data signal Data received from the first end of the second thin film transistor M2 is written into the first end of the first thin film transistor M1 through the second end of the second thin film transistor M2. The gate electrode of the first thin film transistor M1 and the storage capacitor Cst are charged through the diode connection structure of the first thin film transistor M1.

The charging formula of the storage capacitor Cst is as follows:

$$Vt=V0+(VQ-V0)*(1-\exp(-T/RC))$$

V0 is an initial potential of the storage capacitor Cst, VQ is a target charging potential, T is the charging time, Vt is a potential of the storage capacitor Cst at any time t, C is the capacitance value of the storage capacitor Cst, and R is a charging load.

When the data signal Data is written, the charging time T is fixed, and T is the time when the second control signal T2 at a low voltage level. The values of the capacitance value C of the storage capacitor Cst may affect the potential of the gate electrode of the first thin film transistor M1, and the potential of the gate electrode of the first thin film transistor M1 may adjust the driving current of the light emitting element 112, thereby adjusting the luminance of the pixel point corresponding to the light emitting element 112. Specifically, when the capacitance value C of the storage capacitor Cst increases, the potential of the gate electrode of the first thin film transistor M1 decreases, the driving current flowing through the light emitting element 112 in the light emitting phase B3 increases, and the display luminance increases.

In the light emitting phase B3, the first control signal T1 is a high voltage level signal, the second control signal T2 is a high voltage level signal, and the enable signal EN is a low voltage level signal, the fifth thin film transistor M5 and the sixth thin film transistor M6 are turned on. In this case, driven by the driving current, the light emitting element 112 starts to emit light.

In the present embodiment, the storage capacitors Cst provided in the unit pixel driving circuit 111 of the first region A and of the second region 13, have different capacitance values so that the first region A and the second region B have the same display luminance. Specifically, when the first thickness is greater than the second thickness, the capacitance value of the storage capacitor Cst in the first region A is greater than that of the storage capacitor Cst in the second region B. On the contrary, when the first thickness is smaller than the second thickness, the capacitance value of the storage capacitor Cst provided in the first region A is smaller than the capacitance value of the storage capacitor Cst provided in the second region B.

Figure 5:
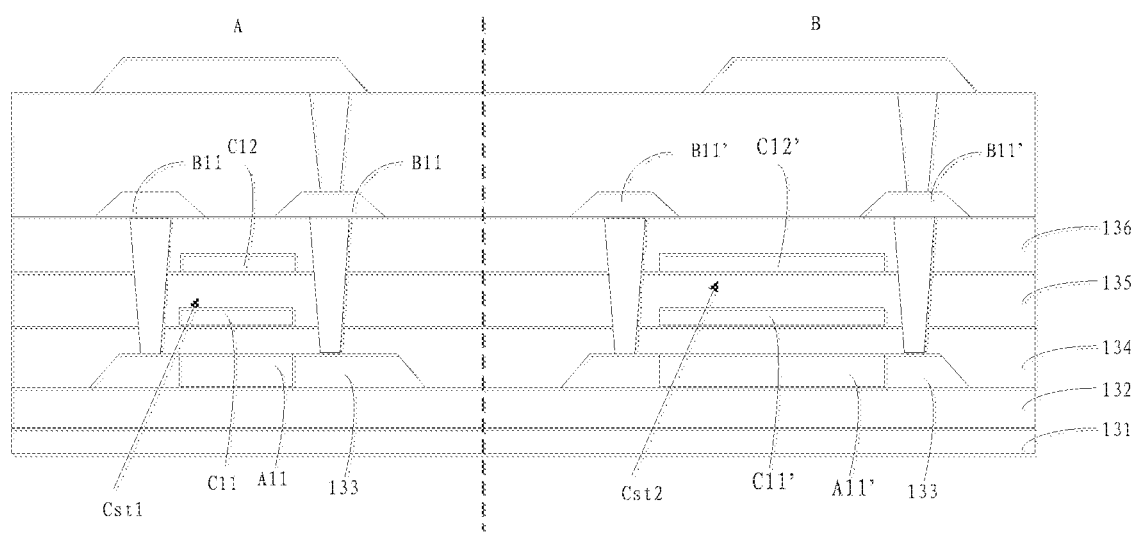
FIG. 5 is a partial sectional view of the AMOLED panel shown in FIG. 1.

Referring to FIG. 5 together, FIG. 5 is a partial sectional view of the AMOLED panel shown in FIG. 1. As shown in FIG. 5, the AMOLED panel may include: a buffer layer 132 and an active semiconductor layer 133 sequentially disposed on the substrate 131, a first gate electrode A11 and a second gate electrode A11' which are disposed on the active semiconductor layer 133 and spaced apart from each other, a first insulating layer 134 disposed on the first gate electrode A11 and the second gate electrode A11', a first storage capacitor Cst1 disposed on the first insulating layer 134 and corresponding to the first gate electrode A11, and a second storage capacitor Cst2 disposed on the first insulating layer 134 and corresponding to the second gate electrode A11', a third insulating layer 136 disposed on the first storage capacitor Cst1 and the second storage capacitor Cst2, a first source/drain electrode B11 and a second source/drain electrode B11' disposed on the third insulating layer 136, with the first source/drain electrode B11 and the second source/drain electrode B11' contacting with the active semiconductor layer 133 by running through the third insulating layer 136 and the first insulating layer 134. The first storage capacitor Cst1 may be disposed between two first source/drain electrodes B11, and the second storage capacitor Cst2 may be disposed between two second source/drain electrodes B11'. The panel corresponding to the first gate electrode A11, the first storage capacitor Cst1 and the first source/drain electrode B11 may be defined as the first region A. The panel corresponding to the second gate electrode A11', the second storage capacitor Cst2 and the second source/drain electrode B11' may be defined as the second region B.

Specifically, the first storage capacitor Cst1 may include the substrate 131, a first electrode plate C11 disposed on the substrate 131, a first opposite electrode plate C12 disposed above the first electrode plate C11, and a second insulating layer 135 sandwiched between the first electrode plate C11 and the first opposite electrode plate C12. The second storage capacitor Cst2 may include the substrate 131, a second electrode plate C11' disposed on the substrate 131, a second opposite electrode plate C12' disposed above the second electrode plate C11' and the second insulating layer 135 sandwiched between the second electrode plate C11' and the second opposite electrode plate C12'. The area of the first electrode plate C11 may be different from that of the second electrode plate C11', and thus the capacitance value of the first storage capacitance Cst1 may be different from the capacitance value of the second storage capacitance Cst2.

Specifically, when the area of the first electrode plate C11 is larger than the area of the second electrode plate C11', the capacitance value of the first storage capacitor Cst1 is greater than that of the second storage capacitor Cst2. On the contrary, when the area of the first electrode plate C11 is smaller than the area of the second electrode plate C11', the capacitance value of the first storage capacitor Cst1 is smaller than that of the second storage capacitor Cst2.

Figure 6:
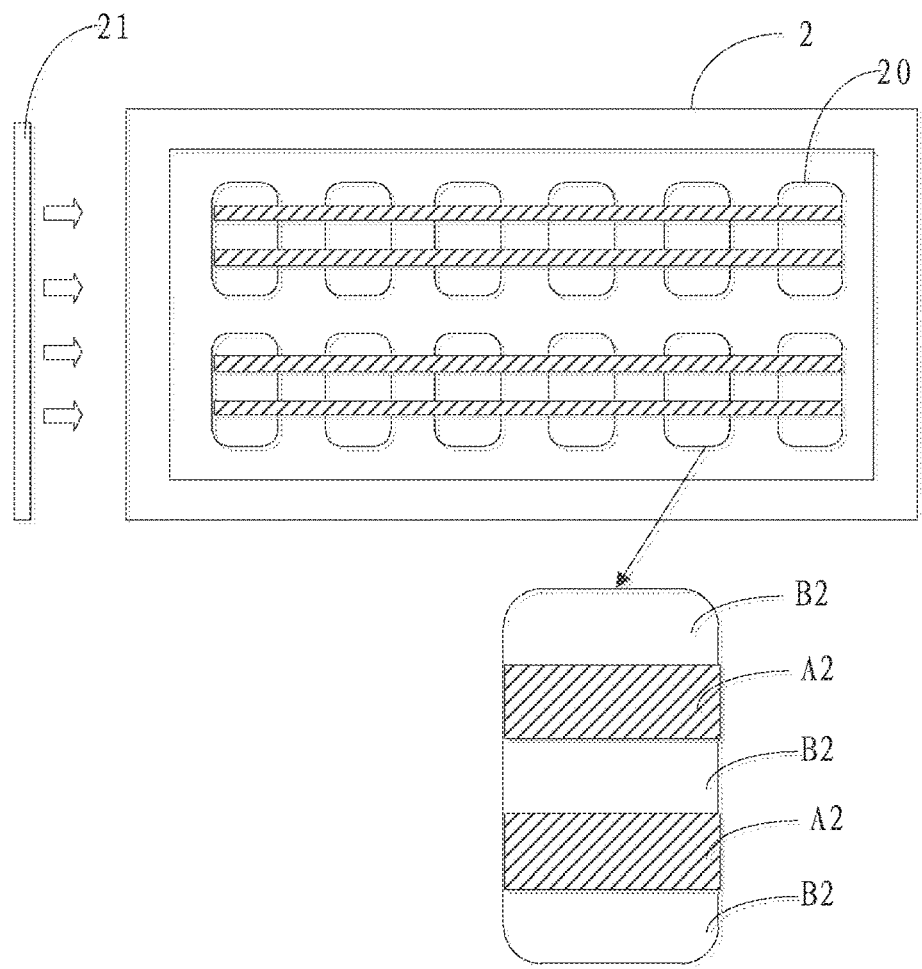
FIG. 6 is a schematic plan view of an AMOLED panel according to a second embodiment of the present disclosure.

FIG. 6 is a schematic plan view of an AMOLED panel according to a second embodiment of the present disclosure. As shown in FIG. 6, a plurality of AMOLED panels 20 may be disposed on a glass substrate 2. Each AMOLED panel 20 may include a plurality of first regions A2 and a plurality of second regions B2, wherein the first regions A2 and the second regions B2 may be spaced from each other on the AMOLED panel 20.

The person skilled in the art may understand that the number of the first regions A2 shown in FIG. 6 is two, and the number of the second regions B2 is three, which is only an example, and may not be a limitation to the present disclosure. In addition, the present disclosure may not limit the specific positions of the first region A2 and the second region B2.

In the present embodiment, the first region A2 may be an overlapping vapor deposition region that is vapor-deposited by adjacent nozzles when the AMOLED panel 20 is vapor-deposited by a line-type vapor deposition source 21, and the second region B2 may be a non-overlap vapor deposition region that is vapor-deposited by a single nozzle. The first thickness is greater than the second thickness.

Figure 7:
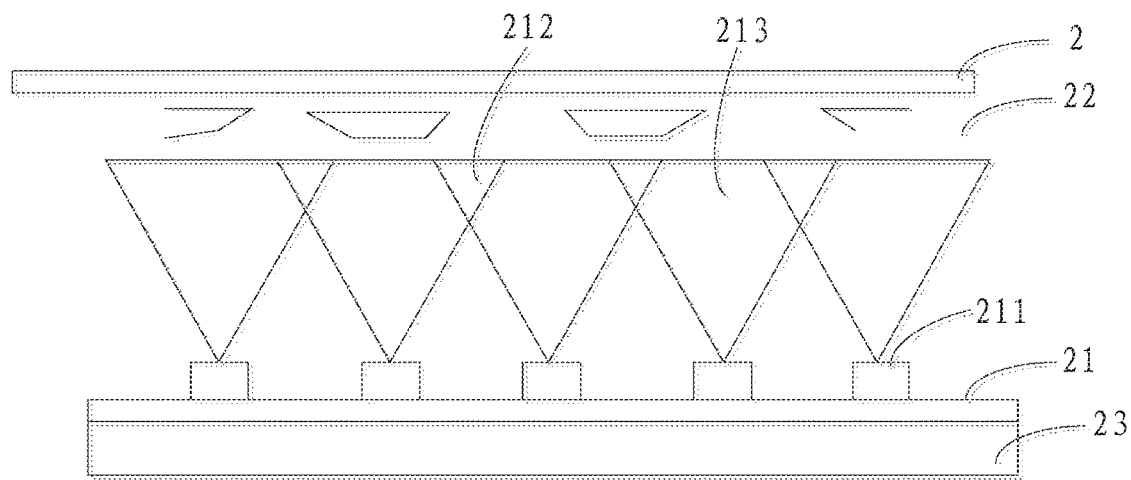
FIG. 7 is a simplified vapor deposition schematic diagram of a line-type vapor deposition source.

Referring to FIG. 7, FIG. 7 is a simplified vapor deposition schematic diagram of a line-type vapor deposition source. As shown in FIG. 7, the positions of the glass substrate 2 and a metal mask plate 22 may be fixed, and the line-type vapor deposition source 21 moves along a long side of the glass substrate 2, and completes the vapor deposition of the OLED light emitting layer through the metal mask plate 22. The line-type vapor deposition source 21 may include a plurality of nozzles 211, and the OLED vapor deposition process may be optimized through controlling the temperatures, vapor deposition rates, and switches of the nozzles 211. A heating device 23 may be provided below the line-type vapor deposition source 2l, and the heating device 23 may control the temperature of each nozzle 211.

Since the vapor deposition source 21 may include a plurality of nozzles 211, overlapping vapor deposition may occur between adjacent nozzles 211, the film thicknesses of the panel 20 in the vapor deposition overlapping area 212 and the film thicknesses of the panel 20 in the non-overlapping vapor deposition area 213 may be uneven, the uneven thickness of the OLED panel 20 lead to the different luminous efficiency of the corresponding pixel point, thus resulting in the problem of display luminance unevenness of the panel.

In the present embodiment, the first region A2 and the second region B2 may be parallel to the long sides of the glass substrate 2. Alternatively, the first region A2 and the second region B2 may be parallel to the short sides of the AMOLED panel 20.

In the present embodiment, the capacitance value of the storage capacitor provided in the unit pixel driving circuit of the first region A2 is greater than the capacitance value of the storage capacitor provided in the unit pixel driving circuit of the second region B2, so the display luminance of the pixel points in the first region A2 is higher than the display luminance of the pixel points in the second region B2, thus remedying the problem that the display luminance of the first region A2 is decreased because the first thickness is larger than the second thickness, further providing the same display luminance in the first display area A2 and the second region B2. The unit pixel driving circuit and the storage capacitor have been described in detail in the above description, and will not be repeated here.

Figure 8:
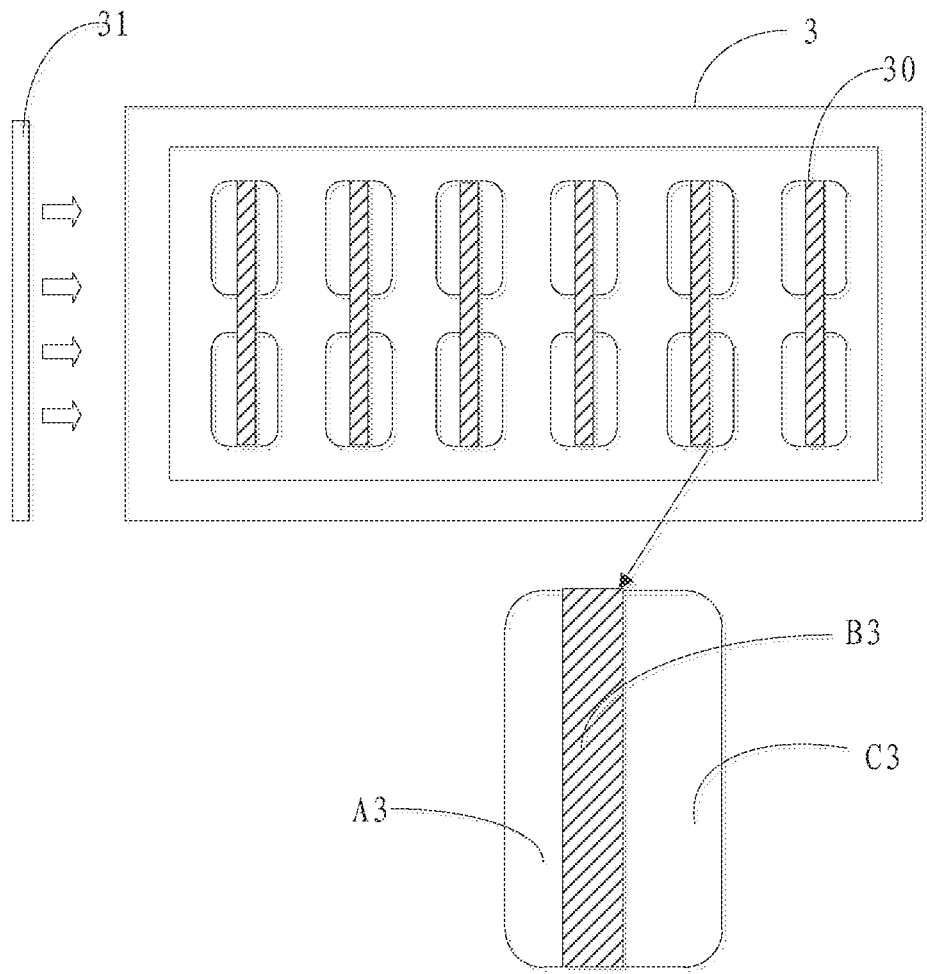
FIG. 8 is a schematic plan view of an AMOLED panel according to a third embodiment of the present disclosure.

FIG. 8 is a schematic plan view of an AMOLED panel according to a third embodiment of the present disclosure. As shown in FIG. 8, a plurality of AMOLED panels 30 may be disposed on the glass substrate 3. Each AMOLED panel 30 may include a first region A3 having a first thickness, a second region B3 having a second thickness, and a third region C3 having a second thickness.

The first region A3 may be a vapor deposition region corresponding to a first vapor deposition temperature when the AMOLED panel 30 is vapor-deposited by a line-type vapor deposition source 31, the second region B3 may be a vapor deposition region corresponding to a second vapor deposition temperature, and the third region C3 may be a vapor deposition region corresponding to a third vapor deposition temperature. In this embodiment, the first vapor deposition temperature is higher than the second vapor deposition temperature, and the second vapor deposition temperature is higher than the third vapor deposition temperature, so that the first thickness is higher than the second thickness, and the second thickness is higher than the third thickness. In other embodiments, the second thickness may be the highest, and the first thickness is equal to the third thickness and smaller than the second thickness, and the like.

During the vapor deposition of the line-type vapor deposition source 31 on the glass substrate 3, with the vapor deposition progressing, the vaporization temperature changes as the heating temperature supplied to the nozzle changes. For example, as the temperature supplied to the nozzle gradually decreases, the evaporation temperature becomes gradually lowered. In this case, on each AMOLED panel 30, the vapor deposition temperatures of the first region A3, the vapor deposition temperatures of the second region B3 and the vapor deposition temperatures of the third region C3 may be different from each other.

In the present embodiment, the first region A3, the second region B3, and the third region C3 may be parallel to the line-type vapor deposition source 31. In other words, the first region A3, the second region B3, and the third area C3 may be parallel to the long side of the AMOLED panel 30.

In the present embodiment, the capacitance value of the storage capacitor provided in the unit pixel driving circuit of the first region A3 is the largest, the capacitance value of the storage capacitor provided in the unit pixel driving circuit of the third area C3 is the smallest, thus the first region A3, the second region B3, and the third area C3 sharing the same display luminance.

The person skilled in the art may understand that, in other embodiments, each AMOLED panel 30 may also be divided into four regions, five regions, and the like according to the different vapor deposition temperatures, and there is no limitation to the disclosure.

Figure 9:
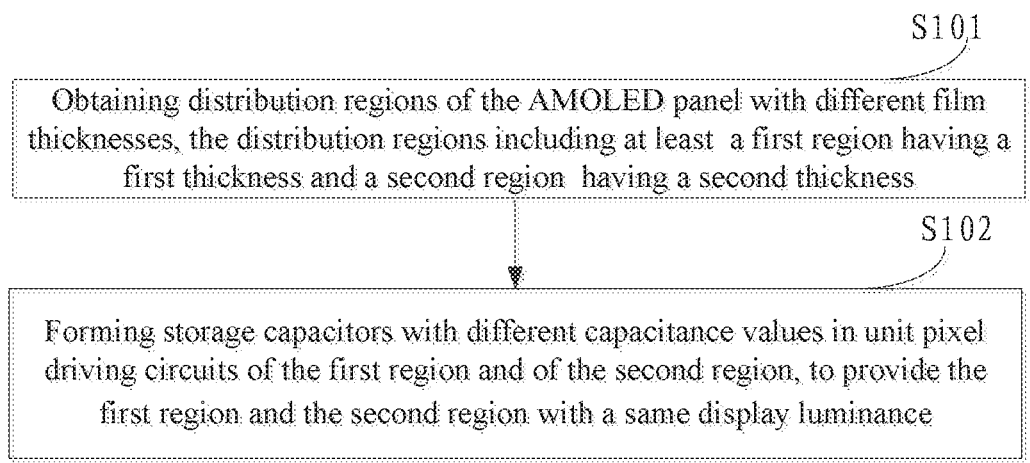
FIG. 9 is a flow chart of a method for reducing display luminance unevenness of an AMOLED panel according to an embodiment of the present disclosure.

FIG. 9 is a flowchart of a method for reducing display luminance unevenness of an AMOLED panel according to an embodiment of the present disclosure. As shown in FIG. 9, the method includes following blocks.

In block S101, the method may include obtaining distribution regions of the AMOLED panel with different film thicknesses; the distribution regions may include at least a first region having a first thickness and a second region having a second thickness.

In block S101, there may be a rule in the distribution regions of the AMOLED panel with different film thicknesses, wherein the different film thicknesses of the AMOLED panel may be formed due to overlapping vapor deposition regions or vapor deposition temperature changes when the AMOLED panel is vapor-deposited by the line-type vapor deposition source.

When the different film thicknesses of the AMOLED panel are caused by the overlapping vapor deposition regions, the first region is an overlap vapor deposition region of adjacent nozzles when the AMOLED panel is vapor-deposited by the line-type vapor deposition source, and the second region is a non-overlapping vapor deposition region vapor-deposited by a single nozzle. The first thickness may be greater than the second thickness.

When the different film thicknesses of the AMOLED panel are caused by the different vapor deposition temperatures, the first region is a vapor deposition region corresponding to the first vapor deposition temperature when the AMOLED panel is vapor-deposited by the line-type vapor deposition source, and the second region is a vapor deposition region corresponding to a second vaporization temperature. When the first vapor deposition temperature is higher than the second vapor deposition temperature, the first thickness may be greater than the second thickness.

Typically, when the panel includes a plurality of the first regions and/or a plurality of the second regions, the first region and the second region may be spaced from each other on the AMOLED panel.

In block S102, the method may include forming storage capacitors with different capacitance values in the unit pixel driving circuits of the first region and of the second region so that the first region and the second region may have the same display luminance.

In block S102, when the first thickness is greater than the second thickness, the capacitance value of the storage capacitor in the first region is greater than the capacitance value of the storage capacitor in the second region, so that the first region and the second region may share the same display luminance. On the contrary, when the first thickness is smaller than the second thickness, the capacitance value of the storage capacitor in the first region is smaller than the capacitance value of the storage capacitor in the second region so that the first region and the second region may share the same display luminance.

The effect of the method for reducing the display luminance unevenness of the AMOLED panel and the AMOLED panel according to the present disclosure, by obtaining distribution regions of the AMOLED panel with different film thicknesses, the distribution regions including at least a first region having a first thickness and a second region having a second thickness, storage capacitors with different capacitance values are formed in the unit pixel driving circuits of the first region and the second region so that the first region and the second region may share the same display luminance. In the present disclosure, by configuring different storage capacitor values in regions with different film thicknesses, the display luminance of the pixel points corresponding to different storage capacitor values are different, so that the display luminance unevenness of the AMOLED panel caused by uneven film thickness can be reduced, thus increasing the AMOLED display quality.

The above description merely illustrates some exemplary embodiments of the disclosure, which however are not intended to limit the scope of the disclosure to these specific embodiments. Any equivalent structural or flow modifications or transformations made to the disclosure, or any direct or indirect applications of the disclosure on any other related fields, shall all fall in the scope of the disclosure.

What is claimed is:

1. An AMOLED panel with different thicknesses, the panel at least having a first region having an organic light emitting layer with a first thickness and a second region having an organic light emitting layer with a second thickness different from the first thickness, the panel comprising:
a substrate;
  a first electrode plate located on the substrate and being in the first region;
  a second electrode plate located on the substrate and juxtaposed with the first electrode plate and being in the second region, wherein the second electrode plate has an area different from that of the first electrode plate;
  an insulating layer located on the first and second electrode plates in the first and second regions;
  a first opposite electrode plate above the first electrode plate and located on the insulating layer and being in the first region;
  a second opposite electrode plate above the second electrode plate and located on the insulating layer and being in the second region;
  wherein a unit pixel driving circuit located in the first region has a first storage capacitor, a unit pixel driving circuit located in the second region has a second storage capacitor, a capacitance value of the first storage capacitor is different from that of the second storage capacitor such that the panel has a same display luminance in the first region and the second region,
  the first storage capacitor is located in the first region and comprises the substrate, the first electrode plate, the first opposite electrode plate and the insulating layer;
  the second storage capacitor is located in the second region and comprises the substrate, the second electrode plate, the second opposite electrode plate and the insulating layer;
  wherein when the first thickness is greater than the second thickness, the capacitance value of the first storage capacitor is greater than that of the second storage capacitor.

2. The panel of claim 1, wherein the first region is an overlapping vapor deposition region that is vapor-deposited by adjacent nozzles when the AMOLED panel is vapor-deposited by a line-type vapor deposition source, and the second region is a non-overlap vapor deposition region that is vapor-deposited by a single nozzle, wherein the first thickness is greater than the second thickness.

3. The panel of claim 1, wherein the first region is a vapor deposition region corresponding to a first vapor deposition temperature when the AMOLED panel is vapor-deposited by a line-type vapor deposition source, and the second region is a vapor deposition region corresponding to a second vapor deposition temperature, and when the first vapor deposition temperature is higher than the second vapor deposition temperature, the first thickness is greater than the second thickness.

4. The panel of claim 2, wherein the panel comprises a plurality of first regions and a plurality of second regions, the first regions and the second regions are spaced from each other on the panel.

5. The panel of claim 3, wherein the panel comprises a plurality of first regions and a plurality of second regions, the first regions and the second regions are spaced from each other on the panel.

6. The panel of claim 1, wherein when the area of the first electrode plate is larger than the area of the second electrode plate, the capacitance value of the first storage capacitor is greater than that of the second storage capacitor.

7. The panel of claim 1, wherein each unit pixel driving circuit comprises a first thin film transistor; a second thin film transistor, a third thin film transistor, a fourth thin film transistor; a fifth thin film transistor; a sixth thin film transistor, a seventh thin film transistor and a corresponding storage capacitor;
  the second thin film transistor comprises a first end configured to receive a data signal, a gate electrode configured to receive a second control signal, and a second end connected to a first end of the fifth thin film transistor and to a second end of the first thin film transistor;
  the fifth thin film transistor comprises a gate electrode connected to a gate electrode of the sixth thin film transistor to receive an enable signal, and a second end connected to one end of the corresponding storage capacitor to receive a power signal;
  the third thin film transistor comprises a first end connected to a gate electrode of the first thin film transistor, another end of the corresponding storage capacitor and a second end of the fourth thin film transistor; a gate electrode connected to the gate electrode of the second thin film transistor to receive the second control signal; and a second end connected to a first end of the first thin film transistor and a second end of the sixth thin film transistor;
  the sixth thin film transistor comprises a first end connected to a first end of the seventh thin film transistor and an anode of a light emitting element;
  the seventh thin film transistor comprises a gate electrode configured to receive a first control signal, and a second end connected to a first end of the fourth thin film transistor to receive a reset voltage;
  the fourth thin film transistor comprises a gate electrode configured to receive the first control signal; and
  the light emitting element comprises a cathode which is grounded.

8. The panel of claim 7, the first end refers to the source electrode of the thin film transistor and the second end refers to the drain electrode of the thin film transistor.

9. An AMOLED panel with different thicknesses, the panel at least having a first region having an organic light emitting layer with a first thickness and a second region having an organic light emitting layer with a second thickness different from the first thickness;
  wherein a unit pixel driving circuit located in the first region has a first storage capacitor, a unit pixel driving circuit located in the second region has a second storage capacitor, a capacitance value of the first storage capacitor is different from that of the second storage capacitor such that the panel has a same display luminance in the first region and the second region;
  the first storage capacitor is located in the first region and comprises a substrate, a first electrode plate, a first opposite electrode plate and an insulating layer;

the second storage capacitor is located in the second region and comprises a substrate, a second electrode plate, a second opposite electrode plate and an insulating layer; wherein the first electrode plate has an area different from that of the second electrode plate.

10. The panel of claim 9, wherein when the first thickness is greater than the second thickness, the capacitance value of the first storage capacitor is greater than that of the second storage capacitor.

11. The panel of claim 9, wherein the first region is an overlapping vapor deposition region that is vapor-deposited by adjacent nozzles when the AMOLED panel is vapor-deposited by a line-type vapor deposition source, and the second region is a non-overlap vapor deposition region that is vapor-deposited by a single nozzle, wherein the first thickness is greater than the second thickness.

12. The panel of claim 9, wherein the first region is a vapor deposition region corresponding to a first vapor deposition temperature when the AMOLED panel is vapor-deposited by a line-type vapor deposition source, and the second region is a vapor deposition region corresponding to a second vapor deposition temperature, and when the first vapor deposition temperature is higher than the second vapor deposition temperature, the first thickness is greater than the second thickness.

13. The panel of claim 11, wherein the panel comprises a plurality of first regions and a plurality of second regions, the first regions and the second regions are spaced from each other on the panel.

14. The panel of claim 12, wherein the panel comprises a plurality of first regions and a plurality of second regions, the first regions and the second regions are spaced from each other on the panel.

15. The panel of claim 9, wherein when the area of the first electrode plate is larger than the area of the second electrode plate, the capacitance value of the first storage capacitor is greater than that of the second storage capacitor.

16. The panel of claim 9, wherein each unit pixel driving circuit comprises a first thin film transistor, a second thin film transistor, a third thin film transistor, a fourth thin film transistor, a fifth thin film transistor, a sixth thin film transistor, a seventh thin film transistor and a corresponding storage capacitor;
    the second thin film transistor comprises a first end configured to receive a data signal, a gate electrode configured to receive a second control signal, and a second end connected to a first end of the fifth thin film transistor and to a second end of the first thin film transistor;
    the fifth thin film transistor comprises a gate electrode connected to a gate electrode of the sixth thin film transistor to receive an enable signal, and a second end connected to one end of the corresponding storage capacitor to receive a power signal;
    the third thin film transistor comprises a first end connected to a gate electrode of the first thin film transistor, to another end of the corresponding storage capacitor and to a second end of the fourth thin film transistor; a gate electrode connected to the gate electrode of the second thin film transistor to receive the second control signal; and a second end connected to a first end of the first thin film transistor and to a second end of the sixth thin film transistor;
    the sixth thin film transistor comprises a first end connected to a first end of the seventh thin film transistor and an anode of a light emitting element;
    the seventh thin film transistor comprises a gate electrode configured to receive a first control signal, and a second end connected to a first end of the fourth thin film transistor to receive a reset voltage;
    the fourth thin film transistor comprises a gate electrode configured to receive the first control signal; and
    the light emitting element comprises a cathode which is grounded.

17. The panel of claim 16, the first end refers to the source electrode of the thin film transistor and the second end refers to the drain electrode of the thin film transistor.

18. A method for reducing display luminance unevenness of an AMOLED panel, comprising:
    obtaining distribution regions of the AMOLED panel with different film thicknesses, the distribution regions comprising at least a first region having an organic light emitting layer with a first thickness and a second region having an organic light emitting layer with a second thickness different from the first thickness; and
    forming a first storage capacitor in a unit pixel driving circuit of the first region and a second storage capacitor in a unit pixel driving circuit of the second region, to provide the first region and the second region with a same display luminance;
    wherein a capacitance value of the first storage capacitor is different from that of the second storage capacitor;
    the first storage capacitor is located in the first region and comprises a substrate, a first electrode plate, a first opposite electrode plate and an insulating layer;
    the second storage capacitor is located in the second region and comprises a substrate, a second electrode plate, a second opposite electrode plate and an insulating layer; wherein the first electrode plate has an area different from that of the second electrode plate.

19. The method of claim 18, wherein when the first thickness is greater than the second thickness, the capacitance value of the first storage capacitor is greater than that of the second storage capacitor.

* * * * *